United States Patent [19]

Chiang

[11] 4,364,077

[45] Dec. 14, 1982

[54] P+N GALLIUM PHOSPHIDE PHOTODIODES

[75] Inventor: Alice M. Chiang, Weston, Mass.

[73] Assignee: The United States of America as represented by the Secretary of the Air Force, Washington, D.C.

[21] Appl. No.: 185,471

[22] Filed: Sep. 9, 1980

[51] Int. Cl.³ .............................................. H01L 27/14
[52] U.S. Cl. ............................................................ 357/30
[58] Field of Search ........................................... 357/30

[56] References Cited

U.S. PATENT DOCUMENTS

| 3,900,865 | 8/1980 | Schaefer | 357/30 |
| 3,958,143 | 5/1976 | Bell | 313/94 |
| 4,141,756 | 2/1982 | Chiang et al. | 357/30 X |

Primary Examiner—Martin H. Edlow
Attorney, Agent, or Firm—Donald J. Singer; William Stepanishen

[57] ABSTRACT

A photodiode detector apparatus having a Gallium Phosphide ion implantation junction thereon to provide high quantum efficiency at wavelengths equal to or less than 0.5 micron incident wavelength while utilizing a shallow junction.

1 Claim, 2 Drawing Figures

P+N GALLIUM PHOSPHIDE PHOTODIODES

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a photodiode detector apparatus, and in particular to a Gallium Phosphide pn junction detector apparatus.

A photodiode is a semiconductor two-terminal component with electrical characteristics that are light-sensitive. All semiconductor diodes are light-sensitive in some degree, unless enclosed in opaque packages, but only those designed specifically as such may be called photodiodes.

Most photodiodes consist of semiconductor Pn junctions housed in a container designed to collect and focus the ambient light close to the junction. They are normally biased in the reverse or blocking directions, therefore, the current is quite small in the dark. When they are illuminated, the current is proportional to the amount of light falling on the photodiode. Photodiodes may be used both to detect the presence of light and to measure light intensity.

The photoelectric behavior of semiconductors, such as germanium or tellurium, differs in a semiconducting emitter completely occupying a closed band of energies, which lies just below a so-called forbidden energy band. The electrons behave quite differently from those in metals. As a result, the photoelectric threshold energy is larger than the electronic work function W. Thus, a semiconductor exhibits a higher photoelectric threshold energy than a metal having the same work function. An example, the metal platinum and the semiconductor tellurium both have the same electronic work function about 4.8 ev. The photoelectric threshold of the platinum is equal to the work function, whereas that for the tellurium is quite higher.

A particularly interesting and important kind of photo-emitter is typified by cesium antimonide, $Cs_3Sb$. This material is a semiconductor having a forbidden energy band about 1.5 ev wide. The photoelectric threshold energy is only slightly higher than this. Electrons excited from the occupied energy band by incident photons cannot assume energies lying in the forbidden band, they must remain in conduction band. Thus, even the slower ones must retain energies only slightly less than that required for escape. The probability of photoemission is higher than for metals for semiconductors that have threshold energies greater than twice the width of the forbidden energy band. $Ca_3Sb$ is sensitive over much of the visible range and can give very high yields in excess of 0.2 electron per incident photon. It is widely used in practical phototubes. The present invention achieves a greater quantum efficiency than heretofore obtainable at relatively small wavelengths.

SUMMARY OF THE INVENTION

The present invention utilizes a gallium phosphide ion implantation in a semiconductor diode junction to provide a photodiode detector apparatus having high quantum efficiency at 0.4 um incident wavelength and a shallow semiconductor junction. The quantum efficiency of the photodiode may be mathematically verified in terms of electron diffusion current density in the p region, drift current in the depletion region and hole diffusion current density. The present gallium phosphide photodiode detector apparatus results in a shallow semiconductor junction apparatus with a quantum efficiency greater than 40 percent.

It is one object of the present invention, therefore, to provide an improved photodiode detector apparatus having a substantially increased quantum efficiency.

It is another object of the invention to provide an improved photodiode detector apparatus having a shallow semiconductor junction in addition to a substantially increased quantus efficiency.

It is yet another object of the invention to provide an improved photodetector apparatus utilizing a GaP ion implantation junction.

It is still another object of the invention to provide an improved photodiode detector apparatus which is responsive to light radiation having a wavelength equal to or less than 0.5 micron.

These and other advantages, objects and features of the invention will become more apparent from the following description taken in conjunction with the illustrative embodiment in the accompanying drawings.

DESCRIPTION OF THE PREFERRED EMBODIMENT

Figure 1:
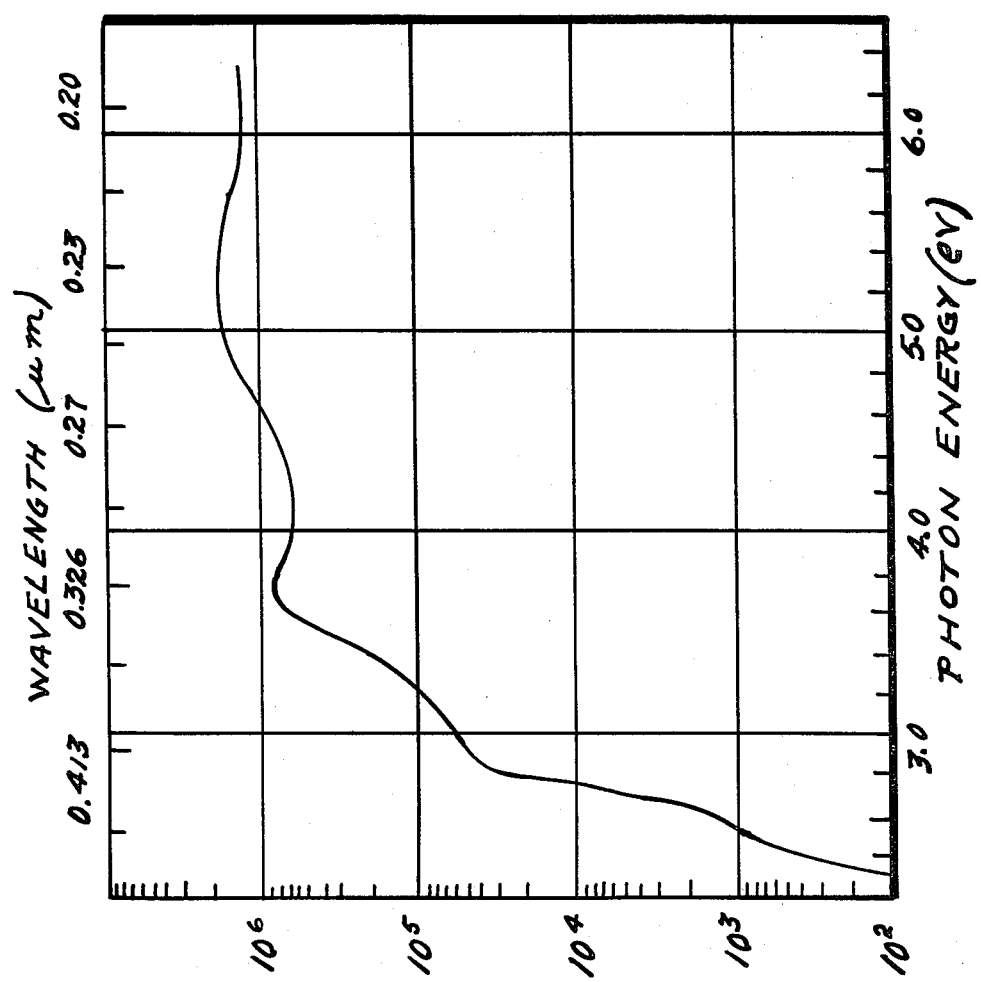
FIG. 1 is a graphical representation of the absorption coefficient data in a gallium phosphide photodiode junction.

The present invention provides a GaP pn junction detector with quantum efficiency of 30% at $\lambda = 0.4$ $\mu$m. The absorption coefficient, $\alpha$, of GaP, at that photo energy is about $7 \times 10^4$ cm$^{-1}$, which is shown in FIG. 1, and corresponds to an absorption length of 0.14 $\mu$m. Therefore, a rather shallow junction would be required to collect the photon generated electron-hole pins.

Figure 2:
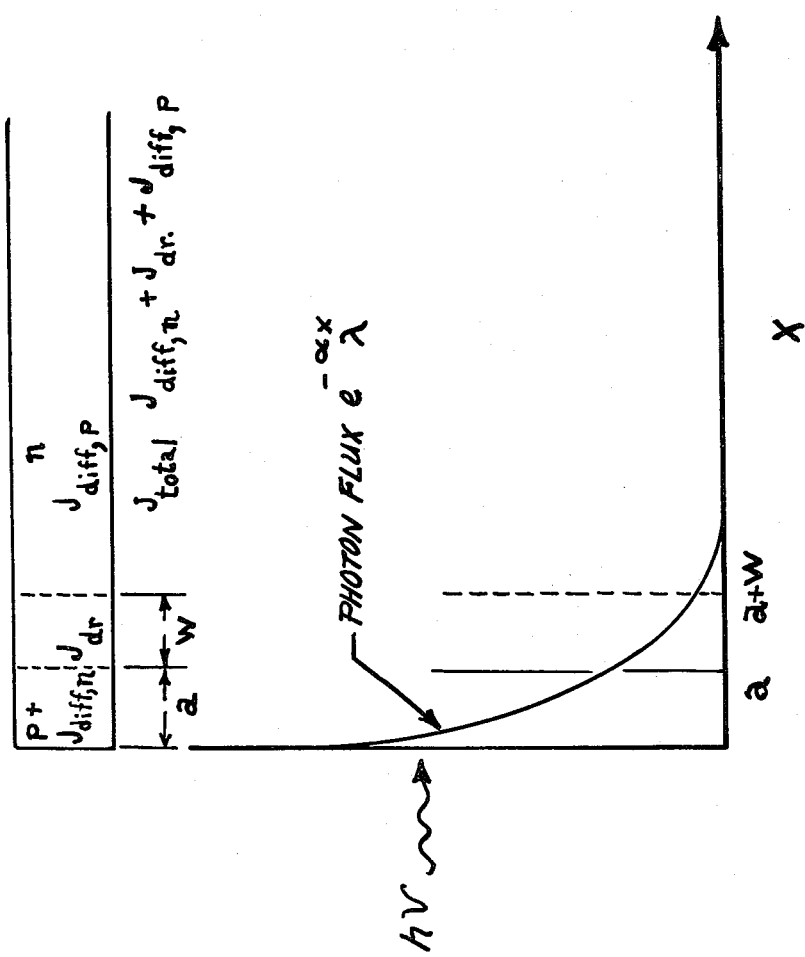
FIG. 2 is a graphical representation of the light intensity versus the distance in a p-n junction photodiode where W is the depletion width and a, is the junction depth.

Under steady-state conditions, the total short-circuit current density of a p on n junction may be defined as:

$$J_{tot} = J_{diff,n} + J_{dr} + J_{diff,p} \quad (1)$$

where $J_{diff,n}$ is the electron diffusion current density due to carriers generated in the p+ region, $J_{dr}$ is the drift current due to carriers generated in the depletion region, and $J_{diff,p}$ is the hole diffusion current density due to carriers generated in the bulk of the semiconductor. These characteristics are shown in greater detail in FIG. 2.

The following analysis will derive the diffusion current from the surface region (p+). The motion of the photogenerated minority carriers (electrons) in the layer is governed by:

$$\frac{J_{diff,n}}{q} = D_e \frac{d}{dx} n \quad (2)$$

$$-\frac{d}{dx}\left(\frac{J_{diff,n}}{q}\right) = \alpha_\lambda \Phi_o (1 - Re) - \alpha_\lambda x \frac{n - n_o}{\tau_e} \quad (3)$$

where $\mu_e$, $\tau_e$, $D_e$ are electron mobility, lifetime and diffusivity, respectively, $\Phi_o$ is the monochromatic incident flux (photons cm² -s), $\alpha_\lambda$, R are the absorption coefficient and reflectance at the incident wavelength $\lambda$, respectively, and $n_o$ is the carrier density at thermal equilibrium. The above minority diffusion, equation may be solved analytically with the assumption that $D_e$, $\mu_e$, $\tau_e$, are constant throughout the surface layer and the boundary conditions:

(1) at the surface, x=0

$$J_{diff,n}/q = sn \quad (4)$$

where s is the surface recombination velocity (2) at the junction interface, x=a n=0

The diffusion current density from the p region into the depletion region may be expressed as $$J_{diff,n} = Q\alpha_\lambda e^{-\alpha\lambda a} + \quad (6)$$

$$\frac{Q}{L_e} e^{-\alpha\lambda a} \frac{\frac{S}{D_e}\cosh\frac{a}{L_e} + \frac{1}{L_e}\sinh\frac{a}{L_e}}{\frac{S}{D_e}\sinh\frac{a}{L_e} + \frac{1}{L_e}\cosh\frac{a}{L_e}} -$$

$$\frac{\frac{Q}{L_e}\left(\frac{S}{D_e} + \alpha_\lambda\right)}{\frac{S}{D_e}\sinh\frac{a}{L_e} + \frac{1}{L_e}\cosh\frac{a}{L_e}}$$

where:

$$Q = \frac{-q\alpha_\lambda \phi_0(1-R)}{\alpha_\lambda^2 - L_e^{-2}} ; L_e = \sqrt{\tau_e D_e} \text{ is the electron diffusion length} \quad (7)$$

The drift current to the depletion region is given by $$J_{dr} = \int_a^{a+W} \alpha_\lambda \Phi_o(1-R)e^{-\alpha\lambda x} dx,$$

where W is the depletion width.

Thus, the preceding equations may be utilized to derive;

$$J_{dr} = q\Phi_0[e^{-\alpha\lambda a} - e^{-\alpha\lambda(a+W)}](1-R). \quad (8)$$

Similarly, the following may be utilized to derive the diffusion current from the n Region into the depletion region such that $$J_{diff,p} = Q' e^{-\alpha\lambda(a+W)}\left[\frac{1}{L_p}\coth\left(\frac{d-a-w}{L_p}\right) - \alpha_\lambda\right] - \quad (9)$$

$$Q' \frac{e^{-\alpha\lambda d}}{L_p \sinh\left(\frac{d-a-w}{L_p}\right)}$$

$$Q' = \frac{-q\alpha_\lambda \phi_0(1-R)}{\alpha_\lambda^2 - L_p^{-2}} \quad \text{where d is the device thickness and } L_p \text{ is the hole diffusion length.} \quad (10)$$

The quantum efficiency of a photodiode is defined as:
$$\eta = J_{tot}/q\phi_0 = (J_{diff,n} + J_{dr} + J_{diff,p})/q\phi_0 \quad (11)$$

Using the material parameter which are listed and shown in Table 1.

TABLE I

| GaP MATERIAL PARAMETERS USED IN CALCULATION OF EQUATION | |
|---|---|
| $L_e = 0.5$ μm | $L_h = 0.5$ μm |
| $D_e = 2/56$ cm²/s | $D_h = \frac{1}{4}$ cm²s |
| $S = 1 \times 10^5$ cm/s | $\alpha_{0.4\,\mu m} = 7 \times 10^4$ cm$^{-1}$ |
| $a = 0.15$ μm | $W = 0.2$ μm |
| $N_d = 5 \times 10^{16}$ cm$^{-3}$ | $R = 0.38$ |
| $d = 300$ μm | |

Quantum efficiency at 0.4 μm of a GaP photodiode can be achieved (0.5+0.26+0.2) (0.62)=0.47

It may be seen that, with a shallow junction, over 40%, quantum efficiency at 0.4 μm of a GaP photodiode can be achieved.

Although the invention has been described with reference to a particular embodiment, it will be understood to those skilled in the art that the invention is capable of a variety of alternative embodiments within the spirit and scope of the appended claims What is claimed is:

1. A photodiode detector apparatus with high quantum efficiency comprising in combination:
a semiconductor body of Group III-V compound having a photoelectric-sensitive surface,
a thin film deposition of a second group III-V compound atop said semiconductor body to form a p-n junction, said p-n junction forms a photodiode being highly responsive to upper-level ultraviolet light radiation, said p-n junction has a shallow junction depth, said photodiode has a quantum efficiency greater than 30% at a wavelength of 0.4 μm, said photodiode is responsive to ultraviolet radiation having a wavelength smaller than 0.4 μm, said photodiode junction is formed by a GaP ion implantation, and said photodiode junction depth equals 0.15 μm.

* * * * *